(12) United States Patent
Chang

(10) Patent No.: US 8,033,325 B2
(45) Date of Patent: Oct. 11, 2011

(54) HEAT DISSIPATION APPARATUS WITH COARSE SURFACE CAPABLE OF INTENSIFYING HEAT TRANSFER

(75) Inventor: Shih-Wei Chang, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 1112 days.

(21) Appl. No.: 11/781,955

(22) Filed: Jul. 24, 2007

(65) Prior Publication Data

US 2009/0025912 A1 Jan. 29, 2009

(51) Int. Cl.
*F28F 13/02* (2006.01)
*F28F 13/12* (2006.01)

(52) U.S. Cl. .................................. 165/133; 165/109.1

(58) Field of Classification Search .................. None
See application file for complete search history.

(56) References Cited

U.S. PATENT DOCUMENTS

| | | | | |
|---|---|---|---|---|
| 989,185 | A * | 4/1911 | Onions et al. ............ | 165/153 |
| 3,741,285 | A * | 6/1973 | Kuethe ..................... | 165/181 |
| 5,361,828 | A * | 11/1994 | Lee et al. ................. | 165/109.1 |
| 5,833,389 | A * | 11/1998 | Sirovich et al. .......... | 405/52 |
| 6,321,835 | B1 * | 11/2001 | Damsohn et al. ........ | 165/159 |
| 6,644,388 | B1 * | 11/2003 | Kilmer et al. ............ | 165/133 |
| 6,883,597 | B2 * | 4/2005 | Thors et al. .............. | 165/133 |
| 7,373,778 | B2 * | 5/2008 | Bunker et al. ............ | 60/752 |
| 7,422,051 | B2 * | 9/2008 | Sinha ....................... | 165/80.2 |
| 2006/0254751 | A1 * | 11/2006 | Sinha ....................... | 165/80.3 |
| 2007/0209788 | A1 * | 9/2007 | Jing et al. ................ | 165/177 |
| 2008/0314558 | A1 * | 12/2008 | Sinha ....................... | 165/80.3 |

* cited by examiner

*Primary Examiner* — Allen Flanigan

(57) ABSTRACT

A heat dissipation apparatus with coarse surface capable of intensifying heat transfer includes a main body and a heat transfer intensifying unit. The main body provides four plate members to define a flow passage. The heat transfer intensifying unit is provided on the surface of one of the plate members or the surfaces of two of the plate members and further includes at least a raised part and a plurality of fish-scale-like parts. The raised parts are disposed slightly upright from said surface and spacing apart a distance from each other. The fish-scale-like parts each are disposed on the surface of the main body next to the raised parts orderly, provide a recess toward the surface of the main body with an inclining angle from the surface of the main body, have a vertical edge and a sharp end and the sharp end is formed at an intersection of the vertical edge of the respective fish-scale-like part. The raised parts and the fish-scale-like parts allow fluid near the respective surface of the main body creating eddy flows and secondary flows and breaking boundary layers of the fluid for promoting heat transfer efficiency.

1 Claim, 10 Drawing Sheets

HEAT DISSIPATION APPARATUS WITH COARSE SURFACE CAPABLE OF INTENSIFYING HEAT TRANSFER

BACKGROUND OF THE INVENTION

1. Field of the Invention

The present invention is related to a heat dissipation apparatus with coarse surface capable of intensifying heat transfer and particularly to a heat dissipation apparatus capable of promoting efficiency of heat transfer.

2. Brief Description of the Related Art

Due to precision of the electronic components being fabricated more precise than before, much more heat is generated by the electronic components accordingly. As a result, it is considerably insufficient to dissipate the heat to the ambient environment with the conventional natural or forced convection. Mostly the current way to dissipate the heat is in that the heat sink is provided at the heat source side to guide the heat out and the cooling fins of the heat sink transmit the heat to the ambient environment naturally or forcedly.

However, there are some problems are still unable to be overcome while the popularly employed heat sink with a fan is in operation. For instance, temperature difference between the surfaces of the cooling fins and the airflow passing through the heat sink is merely 5-10° C. and it results in inadequate temperature gradient, and material and structure of the heat sink cause thermal resistance. The preceding problems lead to the conventional heat sink being incapable of dissipating larger amount of heat and the electronic components malfunctioning arose from the limited heat dissipation.

Taiwan Utility Model Application No. 90220898, entitled "HEAT EXCHANGE FIN CAPABLE OF CREATING EDDY FLOW", discloses a fin with several recesses and projections at the surface thereof and two or more pieces of the fins are combined to allow the projections on two adjacent fins contacting with each other. While the fins are assembled as a single unit, work fluid flows through the assembled fins along one-dimensional direction or two-dimensional directions. In this way, the work fluid not only passes through passages between resistant members formed with the recesses and projections but also hits the resistant members and changes both moving direction and moving speed thereof. Under this circumference, phenomenon of turbulence created by the work fluid is intensified to increase thermal convection effect between the work fluid and the respective fin.

However, the preceding prior art still has problems while in practice. The flow passage is reduced because of the resistant members between the fins and a great deal of reversed pressure is created to lessen fluid input. Next, frictional resistance is formed between the work fluid and the surface of the respective fin and between the work fluid and the resistant members, that is, there are two-dimensional fluid frictional resistant forces retarding the fluid speed. Further, thickness of boundary layer increases along with flow distance and, under this circumference, the thermal resistance increases accordingly to influence effect of heat transfer. Thus, heat is incapable of being carried out effectively.

SUMMARY OF THE INVENTION

In order to overcome the preceding deficiencies of the prior art, an object of the present invention is to provide a heat apparatus capable of promoting effect of heat transfer.

Another object of the present invention is to provide a heat dissipation apparatus capable of breaking the boundary layer and lowering the thermal resistance.

A further object of the present invention is to provide a heat dissipation apparatus with which a plurality of fish-scale-like parts on a surface thereof to allow the fluid creating eddy flows along the edges of the fish-scale-like parts to constitute the secondary flow with the main flow of the fluid for enhancing effect of heat transfer.

In order to achieve the preceding objects, a heat dissipation apparatus with coarse surface capable of intensifying heat transfer according to the present invention includes a main body with four plate members joining to each other to form a flow passage and a heat transfer intensifying unit. The heat transfer intensifying unit is disposed at one of the surfaces of plate members or at two opposite surfaces of the plate members. The heat transfer intensifying unit further includes at least a raised part and a plurality of fish-scale-like parts. The raised part is disposed slightly upright from said surface and spacing apart a distance from each other. The fish-scale-like parts each are disposed on the surface of the main body next to the raised part orderly, provide a recess toward the respective surface with an angle inclining from the respective surface and have a sharp end, which is formed at an intersection of the edges of any two adjacent fish-scale-like parts.

Alternatively, a heat dissipation apparatus with coarse surface capable of intensifying heat transfer according to the present invention includes a base plate, a plurality of plate members extending upward from the base plate in parallel, a flow passage is formed between any two adjacent plate members and a heat transfer intensifying unit being provided at one or both of two opposite surfaces of the plate members. The heat transfer intensifying unit further includes at least a raised part and a plurality of fish-scale-like parts. The raised part is disposed slightly upright from said surface and spacing apart a distance from each other. The fish-scale-like parts each are disposed on the surface of the main body next to the raised part orderly, provide a recess toward the respective surface with an angle inclining from the respective surface and have a sharp end, which is formed at an intersection of the edges of any two adjacent fish-scale-like parts.

Furthermore, an auxiliary plate member is provided between the adjacent plate members with two opposite plain surface.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
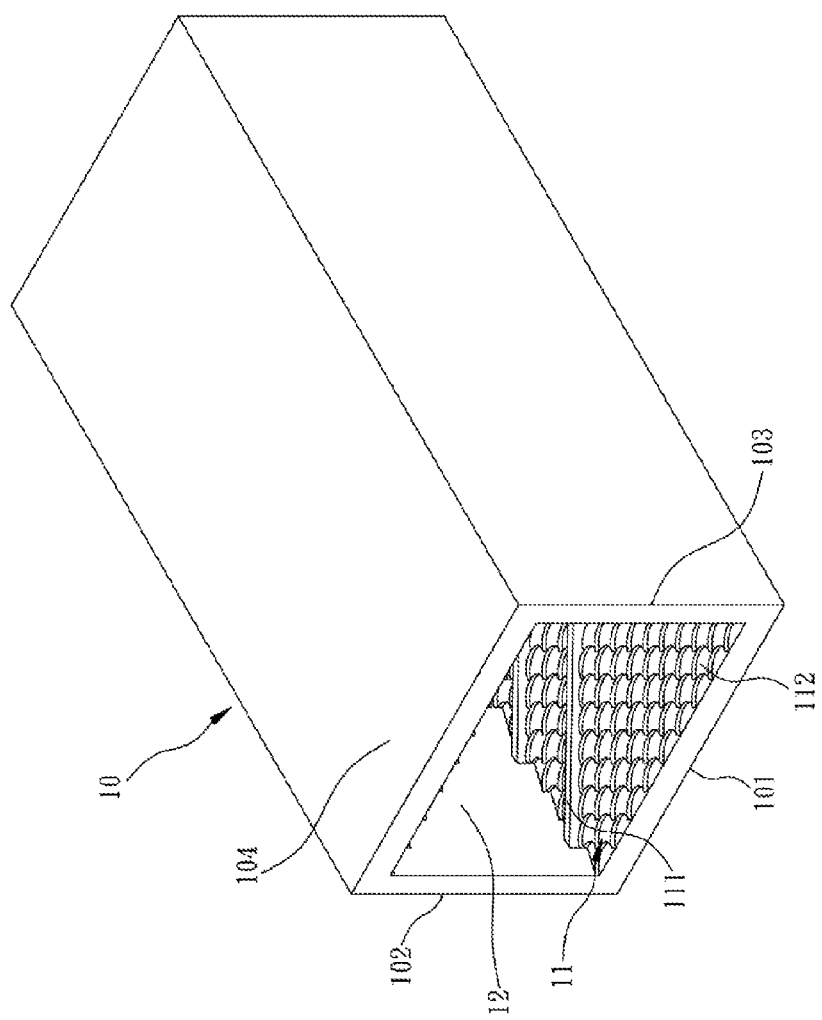
FIG. 1 is a perspective view of the first preferred embodiment of a heat dissipation apparatus with coarse surface capable of intensifying heat transfer according to the present invention.
Figure 2:
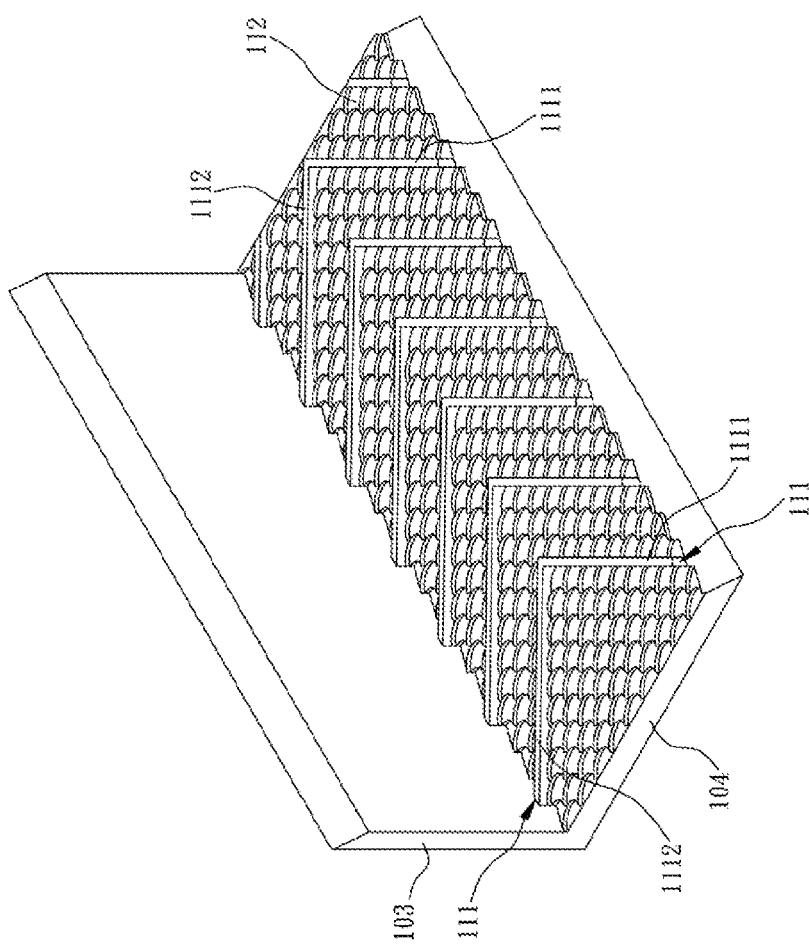
FIG. 2 is a fragmentary perspective view illustrating a heat transfer intensifying unit 11 attached to the fourth plate member 104 of the main member 10 shown in FIG. 1.

Referring to FIGS. 1 to 4, a heat dissipation apparatus with coarse surface capable of intensifying heat transfer according to the present invention includes a main body 10 and a heat transfer intensifying unit 11. The main body 10 provides a first plate member 101, a second plate member 102, a third plate member 103 and a fourth plate member 104. The first plate member 101 is disposed opposite to the fourth plate member 104 and the second plate member 102 is disposed opposite to the third plate member 103. Both of the first and fourth plate members 101, 104 have two opposite lateral side thereof being joined to two opposite lateral sides of both the second and third plate members respectively such that a flow passage 12 is surrounded by the four plate members 101, 102, 103 and 104. The heat transfer intensifying unit 11 is provided at the surface of either the first plate member 101 or the fourth plate member 104. It can be seen in FIG. 1 that the heat transfer intensifying unit 11 is provided at the surface of the first plate member 101. Alternatively, the heat transfer intensifying unit 11 is provided at the surfaces of both the first and fourth plate members 101, 104 (see FIG. 4).

The heat transfer intensifying unit 11 further includes at least a raised part 11 and a plurality of fish-scale-like parts 112. It can be seen in the figures that there are a plurality of raised parts 11 disposed apart a distance from each other on the surface of the first plate member 101 and/or the surface of the fourth plate member 104 respectively, and extending upright from the surfaces and provides at least a first partition member 1111 and a second partition member 1112, which extend along a direction respectively from two opposite lateral sides of the first and fourth plate members 101, 104 and intersect at a central line (not shown) of the surfaces of the first plate member 101 and/or the surface of the fourth plate member 104. Hence, an included angle is constituted between the two partition members 111, 112. It is preferable that the included angle is less than 90°, that is, the respective raised part 111 is provided a shape of "V".

Figure 3:
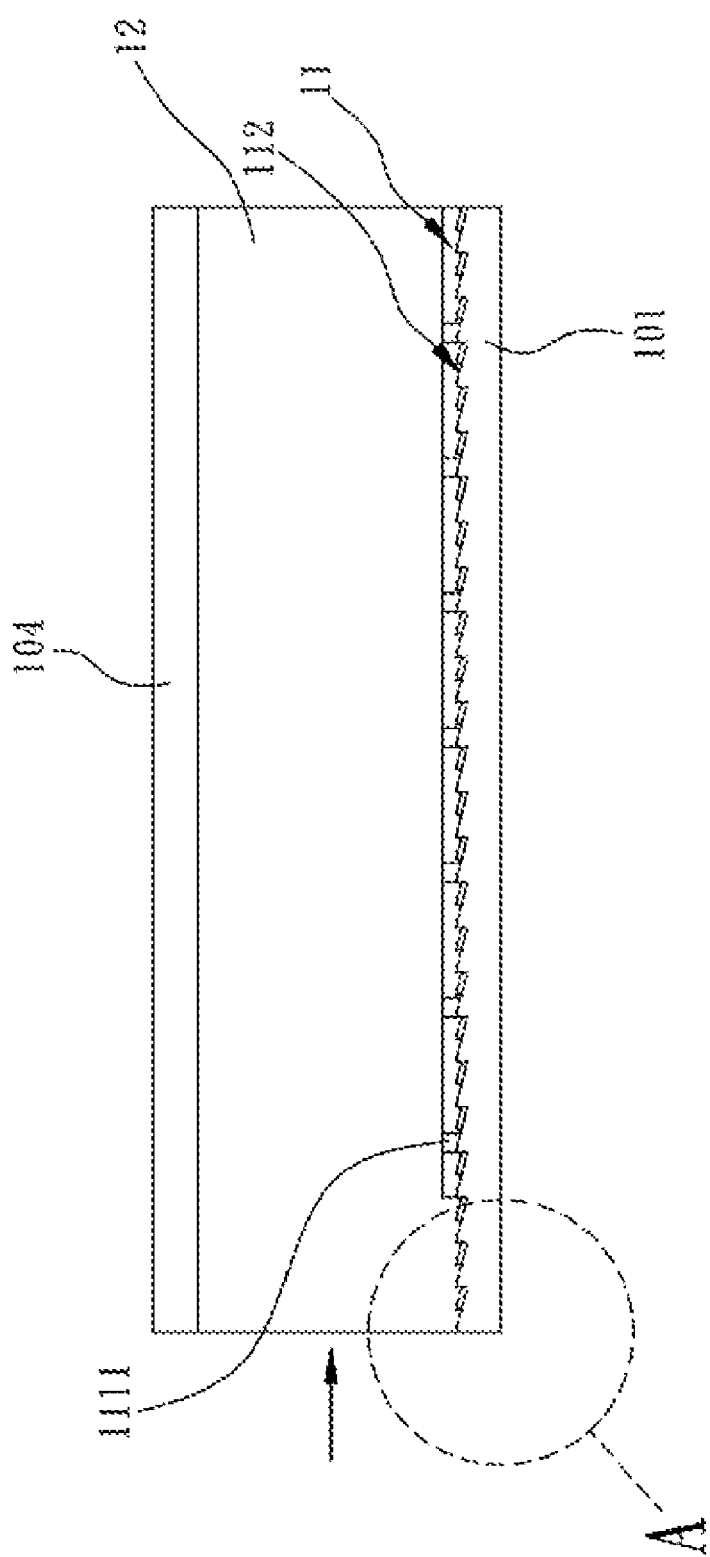
FIG. 3 is a cross section view of the heat dissipation apparatus shown in FIG. 1.
Figure 3A:
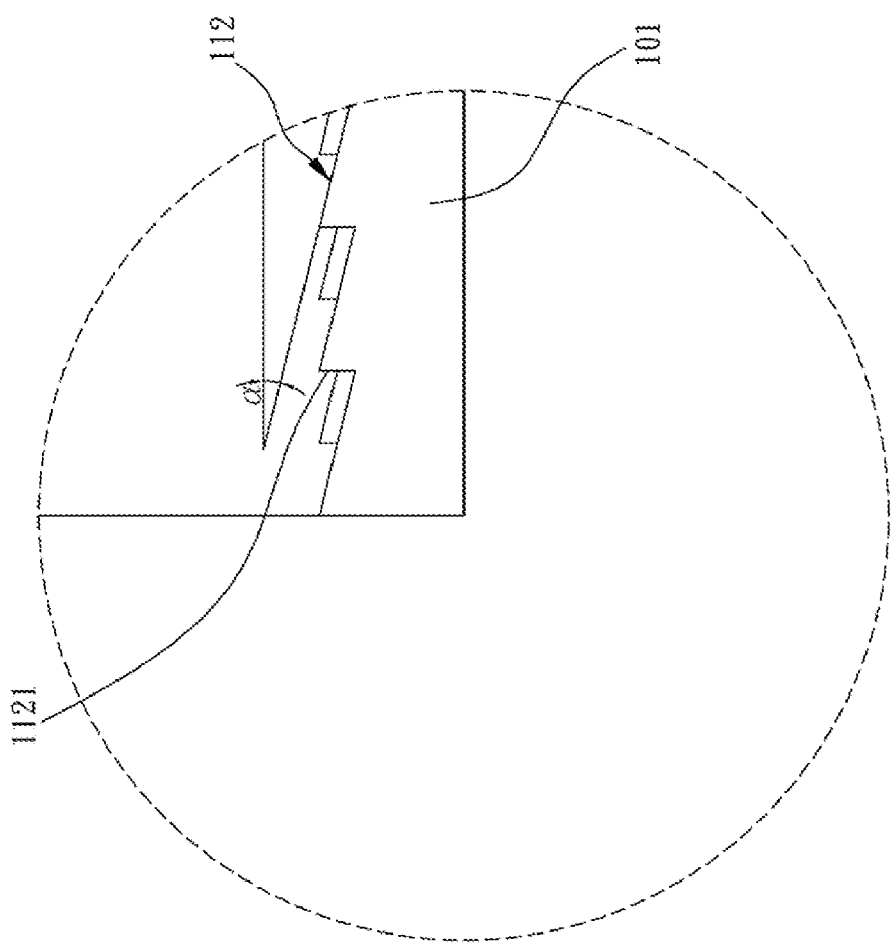
FIG. 3A is an enlarged view of circular portion "A" shown in FIG. 3.
Figure 4:
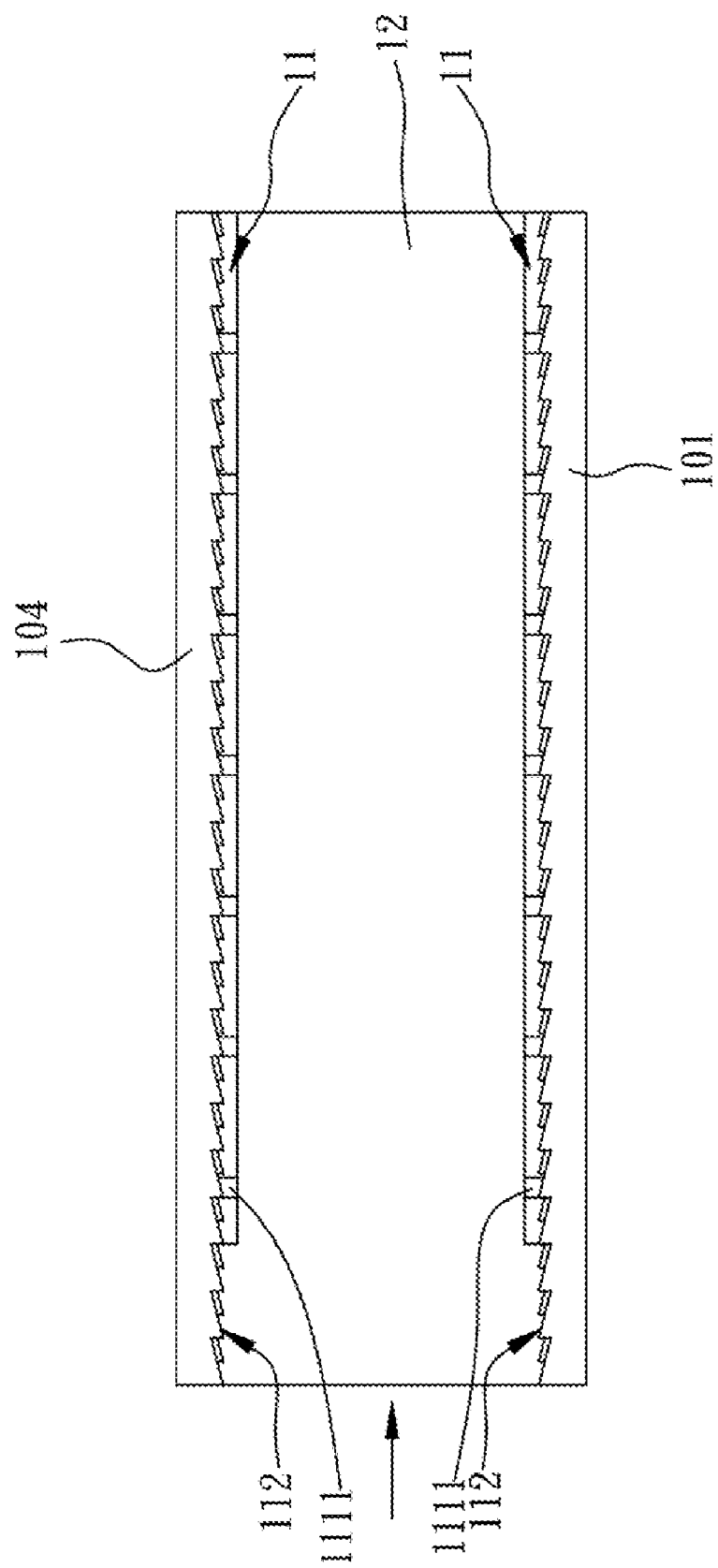
FIG. 4 is a cross section view similar to FIG. 3 illustrating the heat transfer intensifying unit being provided at the first and second plate members respectively.
Figure 5:
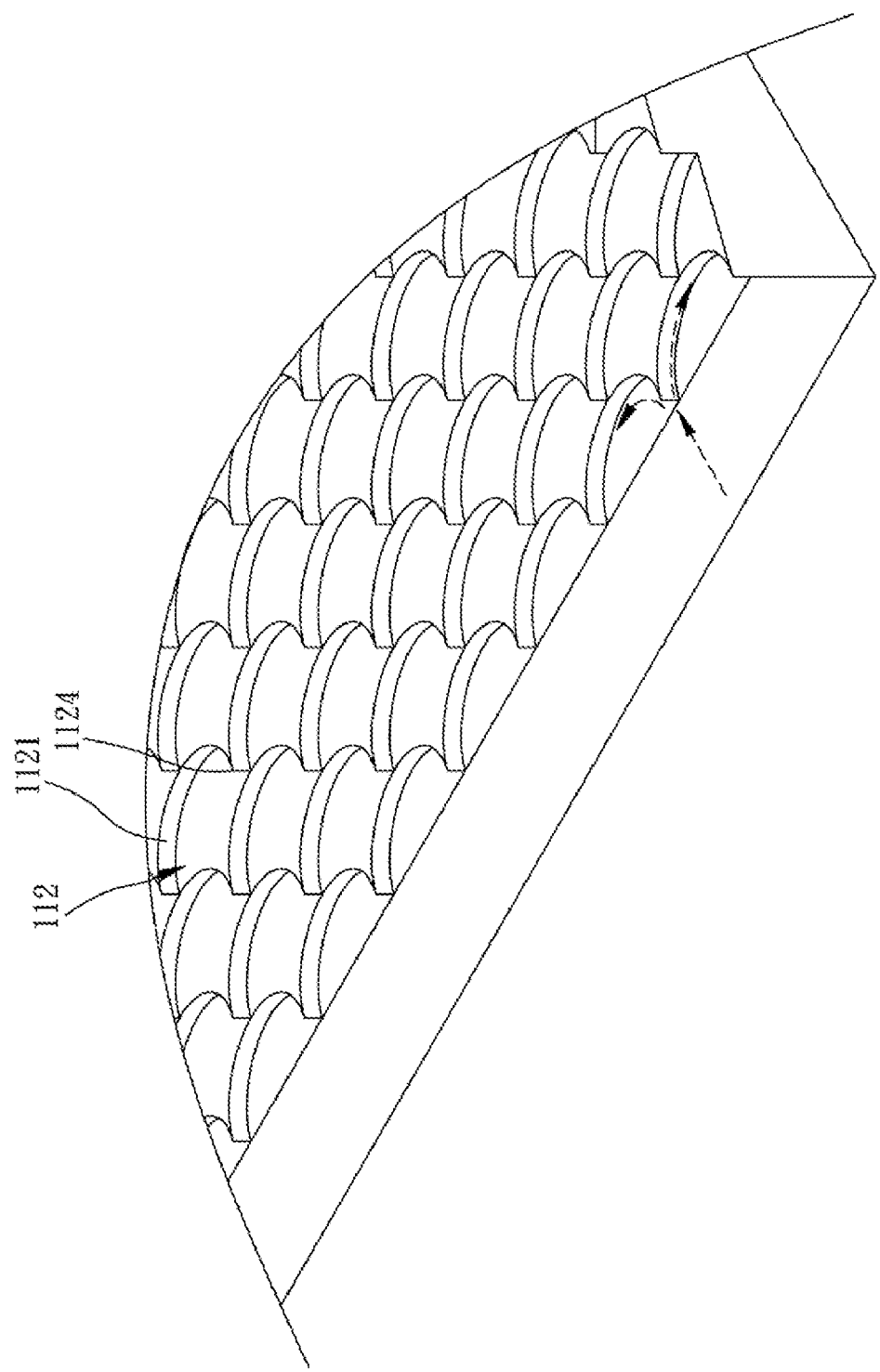
FIG. 5 is a perspective view illustrating part of the heat transfer intensifying unit.
Figure 6:
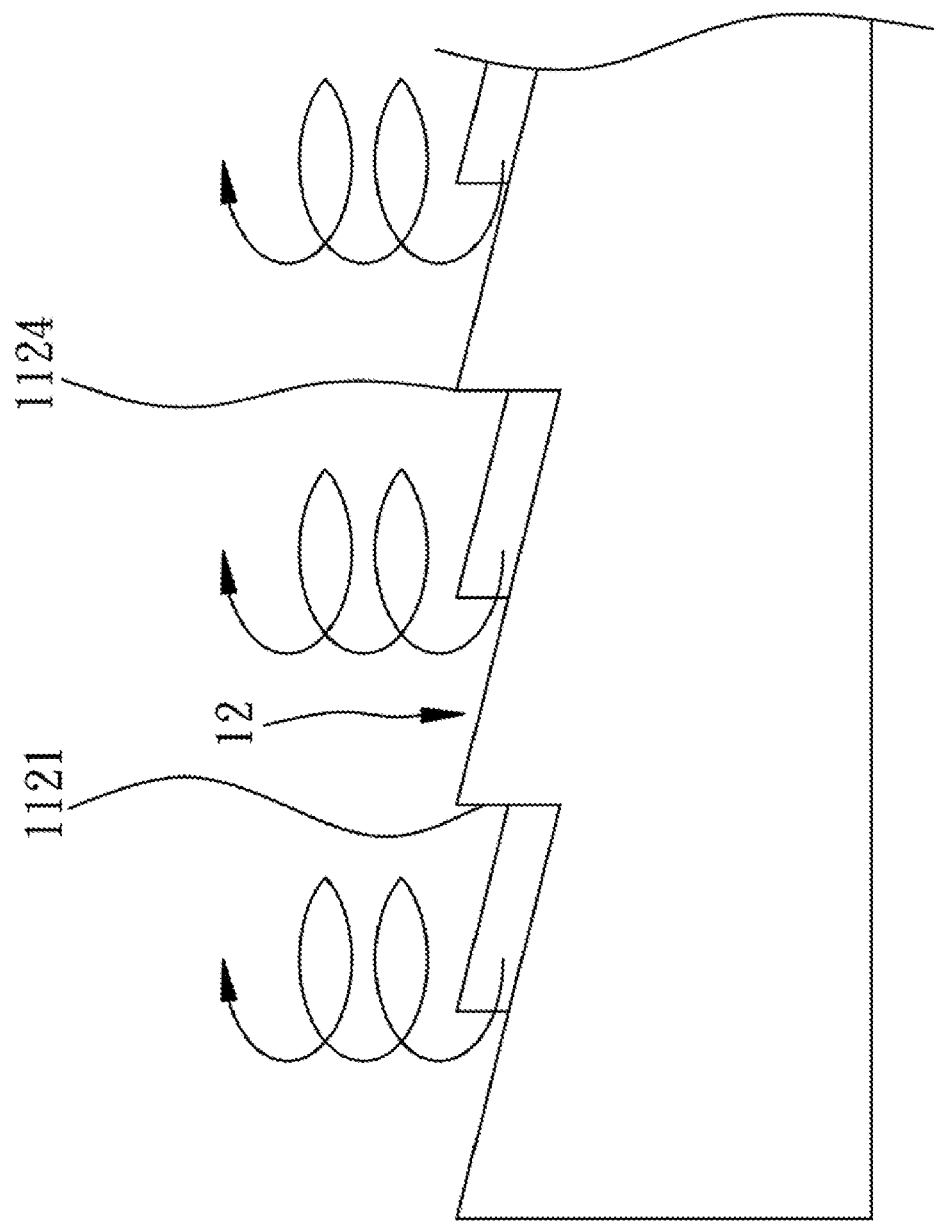
FIG. 6 is fragmentary sectional view of the heat transfer intensifying unit.

The fish-scale-like parts 112 are disposed on the surface of the first plate member 101 and/or the surface of the fourth plate member 104 and each of the fish-scale-like parts 112 indents toward the surface of the first plate member 101 and/or the surface of the fourth plate member 104 with an inclining angle α with respect to an imaginable plane parallel to the surface as shown in FIG. 3. Further, the respective fish-scale-like part 112 has an edge 1121 and a sharp end 1124 and the sharp end 1124 is formed at an intersection of two adjacent edges 1121. Further, the fish-scale-like parts 112 have a flat surface 123. The fish-scale-like parts 112 are arranged and distributed on the surfaces of the first plate member 101 and the second plate member 104 side by side orderly and inclining along with the "V" shaped raised parts 111 in a way of the sharp end 1124 directing to the edge 1121 of another fish-scale-like part 112 before to it.

In addition, a heat generating component is capable of being arranged to contact the outer surface of the main body 10 at the position either the first plate member 101 or the fourth plate member 104, which is attached to the heat transfer intensifying unit 11 (not shown), heat from the heat generating component can transmit to main body 10 via the first plate member 101 or the fourth plate member 104 naturally.

Alternatively, a heat generating component is capable of being arranged to contact the outer surface of the main body 10 at the position either the second plate member 102 or the third plate member 103 if the second plate member 102 or the third plate member 103 is attached to the heat transfer intensifying unit 11 (not shown). Then, heat from the heat generating component can transmit to main body 10 via the second plate member 102 or the third plate member 104 naturally as well.

Referring to FIGS. 3, 4, 5 and 6, when the fluid flows over the surface of the main body 10 along a direction facing the included angle as indication of the arrow to pass through the flow passage 12, the fluid near the surface of the heat transfer intensifying 11 moves across the sharp end 1124 of each fish-scale-like part 112 and is restricted to move downward along the edge 1121 of the respective fish-scale-like part 112. Under this circumference, the fluid is divided by the sharp end 1124 to result in flowing periodically and to create eddy flow at the recess of the respective fish-scale-like part 112 due to the sharp end 1124 allowing the fluid producing a transverse flow. Meanwhile, the eddy flow increases along with increase of the Reynolds number such that the eddy flow mixes the main flow above the surfaces of the plate members 101, 104 to form secondary flow for intensifying turbulence of the fluid and enhancing efficiency of heat transfer. More over, the inclining surface of the respective fish-scale-like part 112 is capable of breaking boundary layer periodically to result in renewing the boundary layer such that mixture of the fluid can be improved to promote effect of the heat transfer due to increase of eddy flow.

Additionally, when the fluid flows toward the raised parts 111, the fluid is obliged to gather toward the central line of the heat transfer intensifying unit 11 and then moves along direction of the main flow to mix with the main flow as the secondary flow and it results in the uniform flow being broken. Hence, the intensity of the turbulence is enhanced with extra area of heat transfer to improve effectiveness of the heat transfer.

Figure 7:
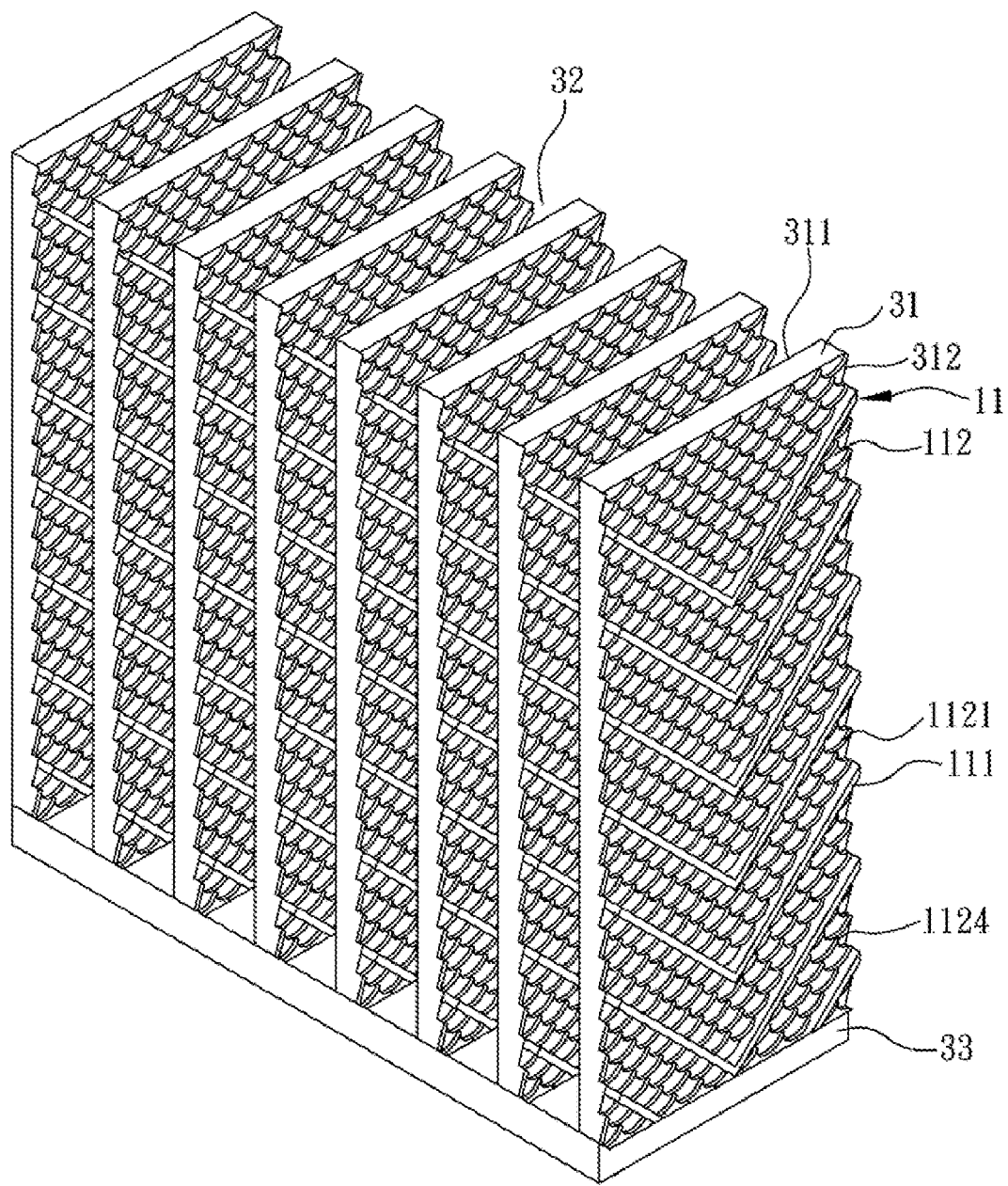
FIG. 7 is a perspective view of the second preferred embodiment of a heat dissipation apparatus with coarse surface capable of intensifying heat transfer according to the present invention.

Referring to FIG. 7, the second embodiment of the present invention is illustrated. A plurality of plate members 31 are arranged in parallel and extend upright from a base plate 33. Each of the plate members 31 provides a first surface 311 and a second surface 312 and the two surfaces 311, 312 are opposite to each other. A flow passage 32 is formed between two adjacent plate members 31 respectively. The preceding heat transfer intensifying unit 11 is provided at either the first surface 311 or the second surface 312 or provided at both the first and second surfaces 311.

Figure 8:
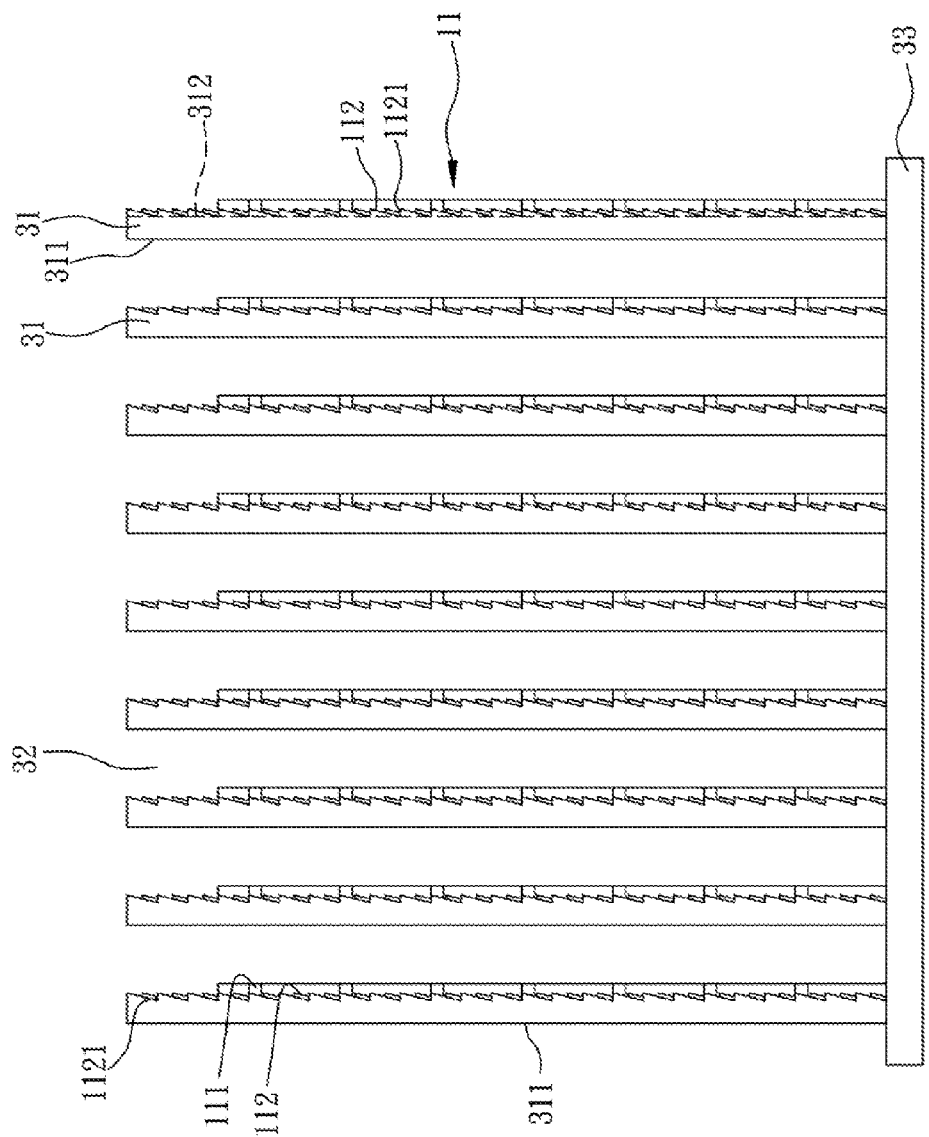
FIG. 8 is a side view of the second preferred embodiment of a heat dissipation apparatus shown in FIG. 7.

Referring to FIG. 8, it can be seen that the heat transfer intensifying unit 11 is provided at the second surface 312 such that it constitutes the respective flow passage with only one heat transfer intensifying unit 11, which is the same as that in the first embodiment so that the fish-scale-like parts 112 with an edge 1121 respectively shown in FIGS. 7 and 8 are arranged as well.

Figure 9:
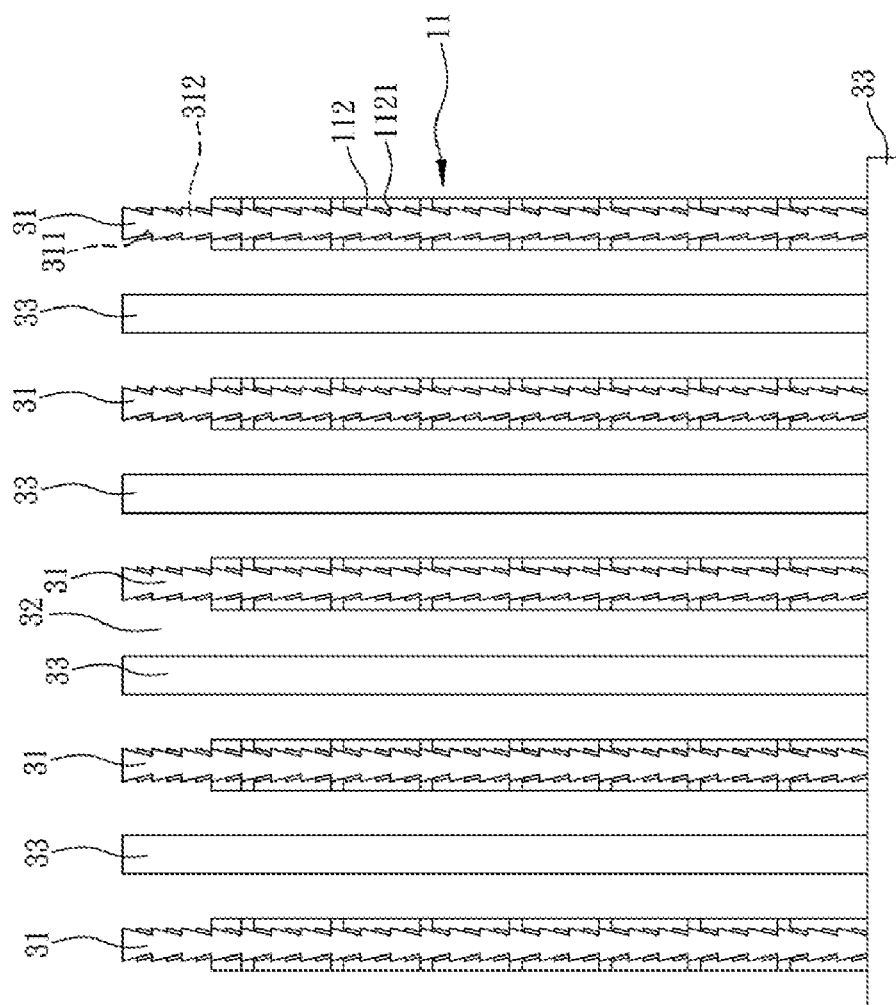
FIG. 9 is a side view similar to FIG. 8 illustrating the third preferred embodiment of a heat dissipation apparatus with coarse surface capable of intensifying heat transfer according to the present invention.

Referring to FIG. 9, a third embodiment of the present invention is illustrated. It can be seen that the arrangement of the third embodiment is similar to FIG. 8. The difference of the third embodiment from the second embodiment is in that an auxiliary plate member 34 is disposed between any two adjacent plate members 31. Each of the auxiliary plate member 34 provides two opposite plain surfaces so that the a flow passage is formed between the respective plate member 31 and the respective auxiliary plate member 34 with one heat transfer intensifying unit 11 too. It is noted that either the plate member 31 or the auxiliary plate member 34 can be connected to a heat guide pipe in series (not shown). Alternatively, the plate member 31 and the auxiliary plate member 34 can be arranged to stack up each other.

Besides, the raised parts 111 shown in the preceding three embodiments can be provided with a semicircular shape instead of a shape with a sharp corner. The raised parts 111 can be arranged to provide the first partition 1111 only and the respective first partition 111 extends along an inclining angle in parallel between two opposite sides of the heat transfer intensifying unit 11. Further, the fish-scale-like parts can be arranged to scatter over the surface of the plate members instead.

While the invention has been described with referencing to preferred embodiments thereof, it is to be understood that modifications or variations may be easily made without departing from the spirit of this invention, which is defined by the appended claims.

What is claimed is:

1. A heat dissipation apparatus with coarse surface capable of intensifying heat transfer comprising:
    a main body providing a first plate member, a second plate member, a third plate member and a fourth plate member, wherein the first plate member is disposed opposite to the fourth plate member, the second plate member is disposed opposite to the third plate member and two opposite sides of the first and fourth plate members are joined to two opposite sides of the second and third plate members respectively such that a passage is formed by the plate members; and
    a heat transfer reinforced unit being provided at a surface of one of the four plate members or two opposite surfaces of the four plate members and further comprising:
    a plurality of raised parts being disposed slightly upright from the respective surface and spacing apart a distance from each other; and
    a plurality of fish-scale-like parts each being disposed on the respective surface next to the respective raised part, providing a recess toward said surface with an inclining angle to the respective surface and having an edge such that a sharp end is formed by every two adjacent ones of said fish-scale-like parts and disposed at an intersection of the respective edge of the two adjacent ones of said fish-scale-like parts;
    wherein said respective raised part and said fish-scale-like parts allow fluid near said respective surface creating eddy flows and secondary flows and breaking boundary layers of the fluid such that a heat generating component is capable of contacting an outer side of the main body at another surface opposite to the heat transfer intensifying unit for promoting heat transfer efficiency;
    wherein the respective raised part has a first partition member and a second partition member extending from two opposite lateral sides of the respective surface toward a central line of the respective surface such that said two partition members intersect at the central line and define an included angle.

* * * * *